(12) United States Patent
Tang

(10) Patent No.: US 10,008,693 B2
(45) Date of Patent: Jun. 26, 2018

(54) ORGANIC LIGHT EMITTING DIODE PACKAGE STRUCTURE

(71) Applicant: Wuhan China Star Optoelectronics Technology Co., Ltd., Wuhan (CN)

(72) Inventor: Yuejun Tang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days. days.

(21) Appl. No.: 15/322,114

(22) PCT Filed: Aug. 19, 2016

(86) PCT No.: PCT/CN2016/096047
§ 371 (c)(1),
(2) Date: Dec. 25, 2016

(87) PCT Pub. No.: WO2018/000553
PCT Pub. Date: Jan. 4, 2018

(65) Prior Publication Data
US 2018/0033997 A1    Feb. 1, 2018

(30) Foreign Application Priority Data
Jun. 27, 2016   (CN) .......................... 2016 1 0478350

(51) Int. Cl.
*H01L 51/00*   (2006.01)
*H01L 51/52*   (2006.01)

(52) U.S. Cl.
CPC ...... *H01L 51/5246* (2013.01); *H01L 51/0097* (2013.01); *H01L 51/524* (2013.01); *H01L 51/5259* (2013.01)

(58) Field of Classification Search
None
See application file for complete search history.

(56) References Cited

U.S. PATENT DOCUMENTS

| | | | |
|---|---|---|---|
| 8,139,177 B2 * | 3/2012 | Nishizawa | G02F 1/133305 349/58 |
| 9,306,188 B2 * | 4/2016 | Kim | H01L 51/5256 |
| 2011/0050657 A1 * | 3/2011 | Yamada | H01L 27/3293 345/204 |
| 2015/0109544 A1 * | 4/2015 | Yeo | G02F 1/133305 349/12 |
| 2015/0162392 A1 * | 6/2015 | Lim | H01L 27/3244 257/72 |
| 2016/0099435 A1 | 4/2016 | Yang et al. | |
| 2017/0018731 A1 | 1/2017 | Cao et al. | |

FOREIGN PATENT DOCUMENTS

| | | |
|---|---|---|
| CN | 101996535 | 3/2011 |
| CN | 104993063 | 10/2015 |
| CN | 105655299 | 6/2016 |
| KR | 20150007872 | 1/2015 |

* cited by examiner

*Primary Examiner* — Joseph Schoenholtz

(57) ABSTRACT

An organic light emitting diode package structure includes a first structure layer, a second structure layer, and a luminous layer disposed between the first structure layer and the second structure layer. Two recesses are formed by bending two respective opposite ends of the first structure layer. End sections of the second structure layer and the luminous layer are located in the two recesses. One of the first structure layer and the second structure layer is a substrate base layer, and the other is a package layer. An area of a display panel is thus increased.

7 Claims, 2 Drawing Sheets

ORGANIC LIGHT EMITTING DIODE
PACKAGE STRUCTURE

RELATED APPLICATIONS

This application is a National Phase of PCT Patent Application No. PCT/CN2016/096047 having International filing date of Aug. 19, 2016, which claims the benefit of priority of Chinese Patent Application No. 201610478350.8 filed on Jun. 27, 2016. The contents of the above applications are all incorporated by reference as if fully set forth herein in their entirety.

FIELD AND BACKGROUND OF THE INVENTION

The present invention relates to the field of displays, and more particularly to an organic light emitting diode (OLED) package structure.

OLEDs are packaged using desiccant package technology, ultraviolet (UV) curing package (aka dam only package), UV curing and filled adhesive package (aka dam-and-fill package), or glass glue package (aka frit package). The ultraviolet light curing technology is the earliest and most common skill employed for the OLED packages. It possesses properties below: no solvent or little solvent is required, which reduces environmental pollution of the solvent; less energy consumption and low temperature curing is possible which is suitable for heat sensitive materials; fast curing speed and high efficiency which can be used in a high speed production line. Occupied space of a curing apparatus is small. Nevertheless, UV glue is an organic material. Spacing between the molecules after curing becomes larger. In conventional OLED package technologies, since the sealant has disadvantages of curing defects, porosity, and a weak binding force between a substrate and a package cover, water vapor and oxygen can easily pass through a space and reach to the inside of the sealed space, thereby decreasing performance in the OLED device and decreasing lifespan. Hence, by controlling a coating weight of the sealant, after the package cover is adhered with the substrate, the sealant has a greater width to prevent moisture from entering. It is very unfavorable to form a narrow frame and increase an area of a display panel.

It is necessary to solve the technical problem in the prior art.

SUMMARY OF THE INVENTION

An object of the present invention is to provide an improved OLED package structure so as to solve the technical problem caused by the frame, this results in disadvantage for increasing of the area of the display panel.

In order to solve the technical problem mentioned above, the present invention provides the technical solutions as follows.

The present invention provides an OLED package structure, comprises:
a first structure layer,
a second structure layer, and
a luminous layer disposed between the first structure layer and the second structure layer,
two recesses are formed by bending two respective opposite ends of the first structure layer, and end sections of the second structure layer and the luminous layer are located in the two recesses, one of the first structure layer and the second structure layer is a substrate base layer, and the other is a package layer.

In the OLED package structure of the present invention, a sealant for sealing is disposed in the recesses.

In the OLED package structure of the present invention, a desiccant layer is disposed in the recesses, and the desiccant layer is located between the sealant and the luminous layer, so the sealant and the luminous layer are spaced apart from each other.

In the OLED package structure of the present invention, the first structure layer comprises rounded curving structures located on the two ends thereof, an end section of each the bending structure is bent to be a rounded surface, and each of the two recesses is bounded by the bending structure and the curving structure.

In the OLED package structure of the present invention, the two ends of the first structure layer are bent four times to sequentially form a first bending section, a second bending section, a third bending section, and a fourth bending section, and each of the two recesses is bounded by the first bending section, the second bending section, the third bending section, and the fourth bending section, where the recesses are L-shaped, and a portion of the second structure layer located in each of the two recesses are bent twice, and a fourth bending structure adaptable with each of the two recesses is formed, where the fourth bending structure is L-shaped.

In the OLED package structure of the present invention, the two ends of the first structure layer are bent twice to sequentially form a first bending section and second bending section, and each of the two recesses is bounded by the first bending section, the second bending section, and a portion which is near the first bending section of the first structure layer, and two ends of the second structure layer are bent four times to sequentially form a first solid section, a second solid section, a third solid section, and a fourth solid section, and the first solid section and the second solid section abut against a mounting slot of the first structure layer, and a restraining slot is defined by the second solid section, where the third solid section, and the fourth solid section, and the second bending section are located in the restraining slot.

In the OLED package structure of the present invention, a sealant is disposed in the restraining slot.

In the OLED package structure of the present invention, the two ends of the first structure layer are bent twice to sequentially form a first bending section and a second bending section, and each of the two recesses is bounded by the first bending section, the second bending section, and a portion which is near the first bending section of the first structure layer, and two ends of the second structure layer are bent twice, and a fourth bending structure adaptable with each of the two recesses is formed, and two ends of the luminous layer are bent twice, and a third bending structure adaptable with each of the two recesses is formed.

In the OLED package structure of the present invention, the substrate base layer is selected from the group consisting of glass, an organic thin film, an inorganic thin film, and a metal foil.

In the OLED package structure of the present invention, the package layer is selected from the group consisting of glass, an organic thin film, an inorganic thin film, and a metal foil.

The present invention also provides an OLED package structure, comprises:

a first structure layer, a second structure layer, and a luminous layer disposed between the first structure layer and the second structure layer, two recesses are formed by bending two respective opposite ends of the first structure layer, and end sections of the second structure layer and the luminous layer are located in the two recesses, one of the first structure layer and the second structure layer is a substrate base layer, and the other is a package layer, a sealant for sealing is disposed in the recesses, a desiccant layer is disposed in the recesses, and the desiccant layer is located between the sealant and the luminous layer, so the sealant and the luminous layer are spaced apart from each other, and the first structure layer comprises rounded curving structures located on the two ends thereof, an end section of each the bending structure is bent to be a rounded surface, and each of the two recesses is bounded by the bending structure and the curving structure.

In comparing of the prior art, in the OLED package structure of the present invention, two ends of the second structure layer and the luminous layer are located in the recesses formed by bending the first structure layer, such that there are no frames at both sides of the package structure, thereby increasing an area of a display device.

DESCRIPTION OF SPECIFIC EMBODIMENTS OF THE INVENTION

Figure 1:
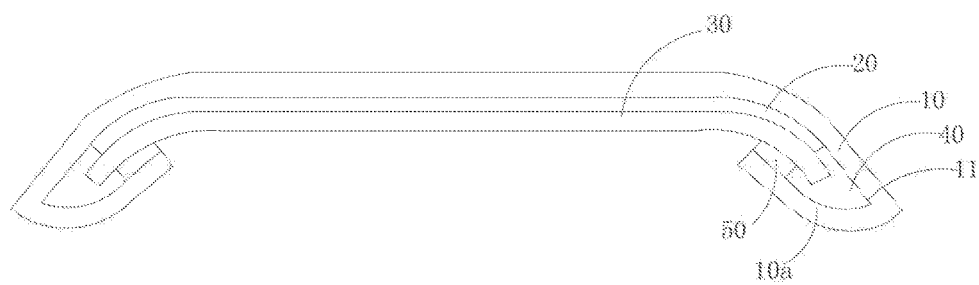
FIG. 1 is a structural diagram of a first preferred embodiment of an OLED package structure of the present invention.

The following embodiments refer to the accompanying drawings for exemplifying specific implementable embodiments of the present invention. Furthermore, directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

In the drawings, the same reference symbol represents the same or similar components.

FIG. 1 is a structural diagram of a first preferred embodiment of an OLED package structure of the present invention. The OLED package structure comprises a first structure layer 10, a luminous layer 20, and a second structure layer 30. One of the first structure layer 10 and the second structure layer 30 is a substrate base layer, and the other is a package layer. That is, the OLED package structure is suitable for employing in a top-emitting type OLED and also suitable for employing in a bottom-emitting type OLED.

The substrate base layer may be selected from the group consisting of glass, an organic thin film, an inorganic thin film, and a metal foil.

The package layer may be selected from the group consisting of glass, an organic thin film, an inorganic thin film, and a metal foil.

The luminous layer 20 is disposed between the first structure layer 10 and the second structure layer 30.

Two recesses 11 are formed by bending two respective opposite ends of the first structure layer 10, and end sections of the second structure layer 30 and the luminous layer 20 are located in the two recesses. Specifically, the second structure layer 30 comprises rounded curving structures located on two ends thereof, and the luminous layer 20 also comprises rounded curving structures located on two ends thereof, so that a curved display side is formed. An end section of each the curving structure is bent to form a bending structure 10a, and the bending structure 10a is a smooth curved surface. Each of the two recesses 11 is bounded by the bending structure 10a and the end section of the first structure layer 10.

Furthermore, a sealant 50 for sealing is disposed in the two recesses 11. In order to make the sealant 50 spaced apart from the luminous layer 20 to protect the luminous layer 20 from damage by the sealant 50 in high temperature environments, a desiccant layer 40 is disposed between the sealant 50 and the luminous layer 20. The desiccant layer 40 can absorb moisture. Moreover, the desiccant layer 40 could be omitted, and the end section of the second structure layer 30 can be covered by the sealant 50, or the end section of the second structure layer 30 can be partially covered by the sealant 50.

In the OLED package structure of this embodiment, since the recesses 11 are formed by bending the first structure layer 10, and two ends of the second structure layer 30 and the luminous layer 20 are located in the recesses 11. Thus, there are no frames at both sides of the package structure, thereby increasing an area of a display panel.

Figure 2:
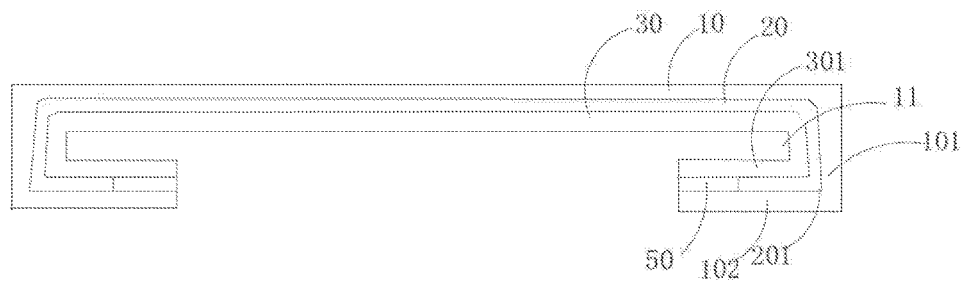
FIG. 2 is a structural diagram of a second preferred embodiment of an OLED package structure of the present invention.

FIG. 2 is a structural diagram of a second preferred embodiment of an OLED package structure of the present invention. The OLED package structure comprises a first structure layer 10, a luminous layer 20, and a second structure layer 30. One of the first structure layer 10 and the second structure layer 30 is a substrate base layer, and the other is a package layer. That is, the OLED package structure is suitable for employing in a top-emitting type OLED and also suitable for employing in a bottom-emitting type OLED.

The substrate base layer may be selected from the group consisting of glass, an organic thin film, an inorganic thin film, and a metal foil.

The package layer may be selected from the group consisting of glass, an organic thin film, an inorganic thin film, and a metal foil.

The luminous layer 20 is disposed between the first structure layer 10 and the second structure layer 30.

Two recesses 11 are formed by bending two respective opposite ends of the first structure layer 10, and end sections of the second structure layer 30 and the luminous layer 20 are located in the two recesses. Specifically, in this embodiment, two end sections of the first structure layer 10 are vertically, or substantially vertically, bent twice to sequentially formed a first bending section 101 and a second bending section 102. Each of the two recesses 11 is bounded by the first bending section 101, the second bending section 102, and a portion which is near the first bending section 101 of the first structure layer 10. Also, a portion of the luminous layer 20, which located in the recess 11, is corresponding vertically bent twice, thereby forming a third bending structure 201 adaptable with each of the two recesses 11. A portion of the 1 second structure layer 30 which located in the recess 11 is also vertically bent twice, thereby forming a fourth bending structure 301 adaptable with each of the two recesses 11.

Furthermore, a sealant 50 for sealing is disposed in the two recesses 11. In order to make the sealant 50 spaced apart from the luminous layer 20 to protect the luminous layer 20 from damage by the sealant 50 in high temperature environments, a desiccant layer is disposed between the sealant 50 and the luminous layer 20. The desiccant layer can absorb moisture and oxygen, thereby increasing lifespan Moreover, the desiccant layer can be omitted, and a gap between the second bending section 102 and the fourth bending structure 301 can be entirely or partially filled with the sealant 50, or the gap between the second bending section 102 and the fourth bending structure 301 can be entirely filled, and a gap between the first bending section 101 and the fourth bending structure 301 can be entirely or partially filled.

It should be understood that the end sections of the luminous layer 20 and the second structure layer 30 can be bent together with the first structure layer 10, or they will not be bent, that is, the luminous layer 20 and the second structure layer 30 are substantially flat.

Figure 3:
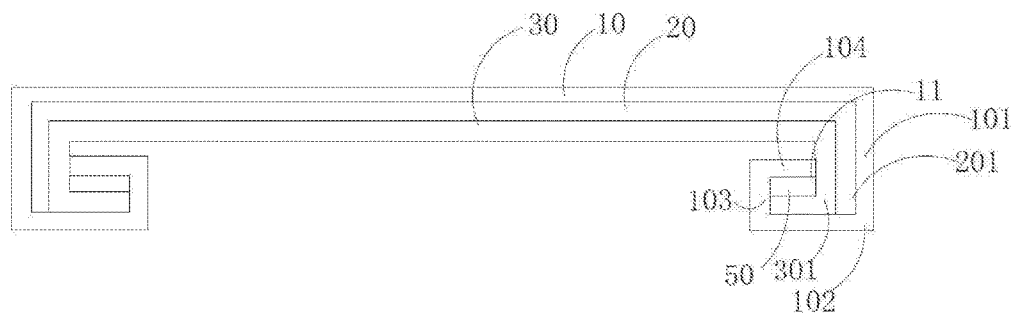
FIG. 3 is a structural diagram of a third preferred embodiment of an OLED package structure of the present invention.

FIG. 3 is a structural diagram of a third preferred embodiment of an OLED package structure of the present invention. The OLED package structure comprises a first structure layer 10, a luminous layer 20, and a second structure layer 30. One of the first structure layer 10 and the second structure layer 30 is a substrate base layer, and the other is a package layer. That is, the OLED package structure is suitable for employing in a top-emitting type OLED and also suitable for employing in a bottom-emitting type OLED.

The substrate base layer may be selected from the group consisting of glass, an organic thin film, an inorganic thin film, and a metal foil.

The package layer may be selected from the group consisting of glass, an organic thin film, an inorganic thin film, and a metal foil.

The luminous layer 20 is disposed between the first structure layer 10 and the second structure layer 30.

Two recesses 11 are formed by bending two respective opposite ends of the first structure layer 10, and end sections of the second structure layer 30 and the luminous layer 20 are located in the two recesses. Specifically, in this embodiment, two ends of the first structure layer 10 are vertically, or substantially vertically, bent four times to sequentially form a first bending section 101, a second bending section 102, a third bending section 103, and a fourth bending section 104. In the first bending operation, they are bent toward a direction of the luminous layer 20. In the second bending operation, they are bent toward an opposite end of the first structure layer 10. In the third bending operation, they are bent toward a direction opposite the direction of the first bending operation. In the fourth bending operation, they are bent toward a direction opposite the direction of the second bending operation. Thus, the recess 11 is formed by bending four times, and the recess 11 is L-shaped. A portion of the luminous layer 20 located in the recess 11 is corresponding vertically bent once, thereby forming a third bending structure 201 adaptable with each of the two recesses 11. A portion of the second structure layer 30 located in the recess 11 is corresponding vertically bent twice, thereby forming a fourth bending structure 301 adaptable with each of the two recesses 11. The fourth bending structure 301 is substantially L-shaped. The end section of the fourth bending structure 301 of the second structure layer 30 vertically abuts against the third bending section 103 of the first structure layer 10. The end section of the fourth bending section 104 of the first structure layer 10 abuts against the fourth bending structure 301 of the second structure layer 30. The fourth bending structure 301 is L-shaped, and the recess 11 is substantially L-shaped, such that the position limitation of the fourth bending structure 301 from the recess 11 is stable, and they will not easily separate.

Furthermore, a sealant 50 for sealing is disposed in the two recesses 11. In order to make the sealant 50 being spaced apart from the luminous layer 20 to protect the luminous layer 20 from damage by the sealant 50 in high temperature environments, a desiccant layer is disposed between the sealant 50 and the luminous layer 20. The desiccant layer can absorb moisture. Moreover, the desiccant layer could be omitted.

Figure 4:
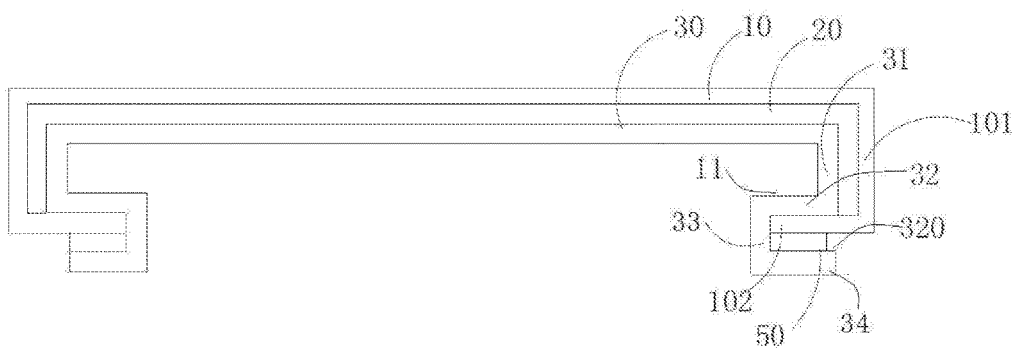
FIG. 4 is a structural diagram of a fourth preferred embodiment of an OLED package structure of the present invention.

FIG. 4 is a structural diagram of a fourth preferred embodiment of an OLED package structure of the present invention. The OLED package structure comprises a first structure layer 10, a luminous layer 20, and a second structure layer 30. One of the first structure layer 10 and the second structure layer 30 is a substrate base layer, and the other is a package layer. That is, the OLED package structure is suitable for employing in a top-emitting type OLED and also suitable for employing in a bottom-emitting type OLED.

The substrate base layer may be selected from the group consisting of glass, an organic thin film, an inorganic thin film, and a metal foil.

The package layer may be selected from the group consisting of glass, an organic thin film, an inorganic thin film, and a metal foil.

The luminous layer 20 is disposed between the first structure layer 10 and the second structure layer 30.

Two recesses 11 are formed by bending two respective opposite ends of the first structure layer 10 twice, and end sections of the second structure layer 30 and the luminous layer 20 are located in the two recesses. Specifically, in this embodiment, two end sections of the first structure layer 10 are vertically bent twice to sequentially form a first bending section 101 and a second bending section 102. Each of the two recesses 11 is bounded by the first bending section 101, the second bending section 102, and a portion which is near the first bending section 101 of the first structure layer 10. A portion of the luminous layer 20 located in the recess 11 is corresponding vertically bent once, thereby forming a third bending structure 201 adaptable with each of the two recesses 11.

Two ends of the second structure layer 30 are bent four times each to sequentially form a first solid section 31, a second solid section 32, a third solid section 33, and a fourth solid section 34. In the first bending operation, they are vertically, or substantially vertically, bent toward a direction away from the luminous layer 20, thereby forming the first solid section 31. In the second bending operation, they are vertically, or substantially vertically, bent toward an opposite end of the second structure layer 30, thereby forming the second solid section 32. In the third bending operation, they are vertically, or substantially vertically, bent toward a direction away from the direction of the luminous layer 20, thereby forming the third solid section 33. In the fourth bending operation, they are vertically, or substantially vertically, bent toward a direction opposite the direction of the second bending operation, thereby forming the fourth solid section 34. The first solid section 31 and the second solid section 32 engage with the recess 11. A restraining slot 320 is formed by the second solid section 32, the third solid section 33, and the fourth solid section 34. The second bending section 102 of the first structure layer 10 is located in the restraining slot 320. By abutting the first solid section 31 and the second solid section 32 of the second structure layer 30 against a mounting slot 11 of the first structure layer 10, and disposing the second bending section 102 of the first structure layer 10 to be located in the restraining slot 320 of the second structure layer 30, the first structure layer 10 and the second structure layer 30 are restrained and engaged with each other, thereby increasing stability of the assembly.

Furthermore, a sealant 50 is disposed in the two restraining slots 320. The end section of the first structure layer 10 can be entirely or partially covered by the sealant 50.

The above descriptions are merely preferable embodiments of the present invention, and are not intended to limit the scope of the present invention. Any modification or replacement made by those skilled in the art without departing from the spirit and principle of the present invention should fall within the protection scope of the present invention. Therefore, the protection scope of the present invention is subject to the appended claims.

What is claimed is:

1. An organic light emitting diode (OLED) package structure, comprising:
    a first structure layer;
    a second structure layer; and
    a luminous layer disposed between the first structure layer and the second structure layer,
    wherein two recesses are formed by bending two respective opposite ends of the first structure layer, and wherein end sections of the second structure layer and the luminous layer are located in the two recesses; and
    wherein one of the first structure layer and the second structure layer is a substrate base layer, and the other is a package layer;
    wherein a sealant is disposed in the recesses; and
    wherein a desiccant layer is disposed in the recesses, wherein the desiccant layer is located between the sealant and the luminous layer, so the sealant and the luminous layer are spaced apart from each other.

2. The OLED package structure as claimed in claim 1, wherein the first structure layer comprises rounded curving structures located on the two ends thereof, an end section of each the bending structure is bent to be a rounded surface, and each of the two recesses is bounded by the bending structure and the curving structure.

3. The OLED package structure as claimed in claim 1, wherein the substrate base layer is selected from the group consisting of glass, an organic thin film, an inorganic thin film, and a metal foil.

4. The OLED package structure as claimed in claim 1, wherein the package layer is selected from the group consisting of glass, an organic thin film, an inorganic thin film, and a metal foil.

5. An organic light emitting diode (OLED) package structure, comprising:
    a first structure layer;
    a second structure layer; and
    a luminous layer disposed between the first structure layer and the second structure layer,
    wherein two recesses are formed by bending two respective opposite ends of the first structure layer, and end sections of the second structure layer and the luminous layer are located in the two recesses;
    one of the first structure layer and the second structure layer is a substrate base layer, and the other is a package layer;
    a sealant for sealing is disposed in the recesses;
    a desiccant layer is disposed in the recesses, and the desiccant layer is located between the sealant and the luminous layer, so the sealant and the luminous layer are spaced apart from each other; and
    the first structure layer comprises rounded curving structures located on the two ends thereof, an end section of each the bending structure is bent to be a rounded surface, and each of the two recesses is bounded by the bending structure and the curving structure.

6. An organic light emitting diode (OLED) package structure, comprising:
    a first structure layer;
    a second structure layer; and
    a luminous layer disposed between the first structure layer and the second structure layer,
    wherein two respective opposite ends of the first structure layer include two recesses, and wherein end sections of the second structure layer and the luminous layer are located in the two recesses; and
    wherein one of the first structure layer and the second structure layer is a substrate base layer, and the other is a package layer;
    wherein the two ends of the first structure layer include a first bending section and second bending section, and each of the two recesses is bounded by the first bending section, the second bending section, and the first structure layer near the first bending section; and
    two ends of the second structure layer include a first solid section, a second solid section, a third solid section, and a fourth solid section; the first solid section and the second solid section abut against a mounting slot of the first structure layer, and a restraining slot is defined by the second solid section, wherein the third solid section, and the fourth solid section, and the second bending section are located in the restraining slot.

7. The OLED package structure as claimed in claim 6, wherein a sealant is disposed in the restraining slot.

* * * * *